US008691610B1

(12) United States Patent
Jeong et al.

(10) Patent No.: US 8,691,610 B1
(45) Date of Patent: Apr. 8, 2014

(54) SEMICONDUCTOR DEVICE AND METHOD FOR MANUFACTURING THE SAME

(71) Applicant: Dongbu HiTek Co., Ltd., Gyeonggi-do (KR)

(72) Inventors: Seong Hun Jeong, Gyeonggi-do (KR); Ki Jun Yun, Gyeonggi-do (KR); Oh Jin Jung, Gyeonggi-do (KR)

(73) Assignee: Dongbu HiTek Co., Ltd., Bucheon-si (KR)

( * ) Notice: Subject to any disclaimer, the term of this patent is extended or adjusted under 35 U.S.C. 154(b) by 0 days.

(21) Appl. No.: 13/826,912

(22) Filed: Mar. 14, 2013

(30) Foreign Application Priority Data

Sep. 20, 2012 (KR) .................. 10-2012-0104397

(51) Int. Cl.
| | | |
|---|---|---|
| *H01L 21/00* | (2006.01) | |
| *H01L 21/4763* | (2006.01) | |
| *H01L 21/302* | (2006.01) | |
| *H01L 21/461* | (2006.01) | |
| *H01L 23/48* | (2006.01) | |
| *H01L 23/52* | (2006.01) | |
| *H01L 29/40* | (2006.01) | |
| *G01P 15/135* | (2006.01) | |
| *H01H 35/02* | (2006.01) | |
| *H01H 35/14* | (2006.01) | |
| *G01P 15/00* | (2006.01) | |

(52) U.S. Cl.
USPC ............. 438/50; 438/666; 438/612; 438/740; 438/634; 257/780; 257/E23.021; 200/61.45 R; 200/61.52; 73/514.01

(58) Field of Classification Search
USPC ........... 438/14, 15, 50, 51, 612, 666; 257/14, 257/737, 738, 780, E29.324, E23.021, 257/E23.069; 200/61.45 R, 61.51, 61.52, 200/61.53, 61.48, 277; 73/514.01, 514.16, 73/514.32, 514.35, 514.36, 514.37, 73/514.38, 488; 340/689
See application file for complete search history.

(56) References Cited

U.S. PATENT DOCUMENTS

| | | | | |
|---|---|---|---|---|
| 4,807,021 A | * | 2/1989 | Okumura ...................... 257/777 |
| 5,410,113 A | * | 4/1995 | Mielke ..................... 200/61.45 R |
| 5,668,399 A | * | 9/1997 | Cronin et al. ................. 257/532 |
| 5,987,988 A | * | 11/1999 | Kunimi et al. ............. 73/514.01 |
| 6,137,062 A | * | 10/2000 | Zimmerman ................. 174/260 |

(Continued)

FOREIGN PATENT DOCUMENTS

| | | |
|---|---|---|
| JP | 2009-238715 | 10/2009 |
| KR | 2009-0094072 | 9/2009 |

OTHER PUBLICATIONS

Jan. 17, 2014 communication from the Korean Patent Office regard a related Korean application.

*Primary Examiner* — Mary Wilczewski
*Assistant Examiner* — Erik T Peterson
(74) *Attorney, Agent, or Firm* — Sherr & Jiang, PLLC

(57) ABSTRACT

A method of manufacturing a semiconductor device including at least one of the following steps: (1) Forming a plurality of lower electrodes over a substrate. (2) Forming a first stop film over the lower electrodes. (3) Forming a filling layer over the first stop film. (4) Forming a second stop film over the filling layer. (5) Forming a first interlayer insulating layer over the second stop film. (6) Forming a plurality of upper electrodes over the first interlayer insulating layer. (7) Forming a second interlayer insulating layer over the upper electrodes. (8) Etching the second interlayer insulating layer and the first interlayer insulating layer to form a cavity. (9) Forming a contact ball in the cavity.

10 Claims, 9 Drawing Sheets

(56) References Cited

U.S. PATENT DOCUMENTS

| | | | |
|---|---|---|---|
| 6,809,421 B1* | 10/2004 | Hayasaka et al. | 257/777 |
| 6,943,339 B2* | 9/2005 | Figueria et al. | 250/222.1 |
| 7,088,258 B2* | 8/2006 | Morrison | 340/689 |
| 7,202,679 B2* | 4/2007 | Maruyama et al. | 324/754.16 |
| 7,233,061 B1* | 6/2007 | Conn | 257/686 |
| 7,241,641 B2* | 7/2007 | Savastiouk et al. | 438/106 |
| 7,649,150 B2* | 1/2010 | Masuda | 200/61.45 R |
| 7,897,887 B2* | 3/2011 | Blank | 200/61.45 R |
| 7,937,846 B2* | 5/2011 | Ozawa | 33/365 |
| 8,146,432 B2* | 4/2012 | Shimase | 73/649 |
| 8,181,354 B2* | 5/2012 | Ozawa | 33/365 |
| 8,416,094 B2* | 4/2013 | Dery et al. | 340/669 |
| 2004/0045354 A1* | 3/2004 | Lentner et al. | 73/504.04 |
| 2004/0084290 A1 | 5/2004 | Higgins et al. | |
| 2008/0037075 A1* | 2/2008 | Masuda | 358/482 |
| 2010/0059345 A1* | 3/2010 | Blank | 200/61.45 R |
| 2010/0061143 A1 | 3/2010 | Carley | |
| 2011/0088478 A1* | 4/2011 | Shimase | 73/649 |
| 2011/0179657 A1* | 7/2011 | Ozawa | 33/377 |
| 2012/0050057 A1* | 3/2012 | Dery et al. | 340/669 |

* cited by examiner

SEMICONDUCTOR DEVICE AND METHOD FOR MANUFACTURING THE SAME

This application claims the benefit of the Patent Korean Application No. 10-2012-0104397, filed on Sep. 20, 2012, which is hereby incorporated by reference in its entirety.

BACKGROUND

Embodiments relate to a semiconductor device and a method for manufacturing a semiconductor device. In embodiments, the semiconductor device may be a Micro Metal Sphere switch and a method for manufacturing a Micro Metal Sphere switch. A MEMs (Micro Metal Sphere system) is a device having a micro-scale size and may be configured to perform specific electro-mechanical operations. MEMs devices may be produced by both specialized semiconductor manufacturing processes and relatively low priced batch manufacturing.

MEMs devices have many potential applications (e.g. sensors in general, pressure sensors, inertia sensors, position sensors in GPS and a game console systems, image sensors in digital cameras or camcorders, RF switch applications, micro-resonators, variable capacitors, and variable inductors). MEMs devices for switch applications may required a reasonable level of reliability and a stable manufacturing yield.

SUMMARY

Embodiments relate to a semiconductor device and a method for manufacturing a semiconductor device. Embodiments may relate to a semiconductor device which substantially avoids the formation of voids between lower electrodes and/or a method for manufacturing method that substantially prevents the formation of voids.

Embodiments relate to a method for manufacturing a semiconductor device including at least one of the following steps: (1) Forming a plurality of lower electrodes on/over a substrate. (2) Forming a first stop film on/over the lower electrodes. (3) Forming a filling layer on/over the first stop film. (4) Forming a second stop film on/over the filling layer. (5) Forming a first interlayer insulating layer on/over the second stop film. (6) Forming a plurality of upper electrodes on/over the first interlayer insulating layer. (7) Forming a second interlayer insulating layer on the upper electrodes. (8) Etching the second interlayer insulating layer and the first interlayer insulating layer to form a cavity. (9) Forming a contact ball in the cavity.

In embodiments, the step of forming a first stop film may include a step of forming the first stop film on/over an upper side and a side of each of the plurality of lower electrodes. In embodiments, the first stop film positioned on/over the side of each of the lower electrodes may be formed spaced from one another.

In embodiments, the step of forming a filling layer may include at least one of the following steps: (1) Forming the filling layer on/over the first stop film. (2) Planarizing the filling layer. (3) Etching the filling layer planarized to expose a portion of the first stop film positioned on/over the upper side of the lower electrodes.

In embodiments, the filling layer etched may have an upper side with a height lower or at the same height as the upper side of the lower electrodes. In embodiments, the step of etching the second interlayer insulating layer and the first interlayer insulating layer to form a cavity may include a step of exposing a side of at least one of the upper electrodes and the second stop film. In embodiments, the step of forming an etch blocking layer covers a side of at least one of the plurality of upper electrodes that passes through the second interlayer insulating layer and the first interlayer insulating layer. In embodiments, the step of forming an etch blocking layer may include a step of forming the etch blocking layer on a portion of the upper side of the upper electrode adjacent to the at least a side of least one of the plurality of upper electrodes. In embodiments, the step of etching the second interlayer insulating layer and the first interlayer insulating layer to form a cavity may include a step of forming the cavity which exposes a side of the etch blocking layer and the second stop film.

In embodiments, the lower electrodes and the upper electrodes may be formed of Al, Au, Cu, an Al—Cu alloy, or similar. The first and second stop films may be formed of SiN, in accordance with embodiments. The first interlayer insulating layer and the second interlayer insulating layer may include at least one of SiO2, FSG (Fluoro Silicate glass), USG (Undoped Silicate Glass), BPSG (Boron Phospho Silicate Glass), TEOS (TetraEthOxySilane), or similar, in accordance with embodiments. The etch blocking layer may be formed of tungsten, in accordance with embodiments.

Embodiments may include a step of forming a contact which is in contact with at least one of the lower electrodes that passes through the first interlayer insulating layer, first stop film, and second stop film, such that at least one of the second upper electrodes are in contact with the contact.

In embodiments, a semiconductor device may include at least one of: (1) a substrate, (2) a plurality of lower electrodes formed on/over the substrate spaced apart from one another, (3) a first stop film formed on/over the lower electrodes, (4) a filling layer formed on/over the first stop film positioned between the lower electrodes, (5) a second stop film formed on/over the first stop film positioned on/over the lower electrodes and the filling layer, (6) a first interlayer insulating layer formed on/over the second stop film, (7) a plurality of upper electrodes formed on/over the first interlayer insulating layer to be spaced from one another, (8) a second interlayer insulating layer formed on/over the upper electrodes, (9) a cavity formed in the second interlayer insulating layer and the first interlayer insulating layer, (10) and a contact ball formed in the cavity.

In embodiments, the first stop film may have portions spaced apart from one another, which may be positioned on a side of each of the lower electrodes. The filling layer may have an upper side with a height lower than or at substantially the same height as the upper side of the lower electrodes, in accordance with embodiments. In embodiments, the cavity may expose a side of at least one of the upper electrodes and the second stop film. In embodiments, a semiconductor device may include an etch blocking layer which covers a side of at least one of the plurality of upper electrodes that passes through the second interlayer insulating layer and the first interlayer insulating layer. In embodiments, a semiconductor device may include a contact which is in contact with at least one of the lower electrodes that passes through at least one of the first interlayer insulating layer, first stop film, and second stop film, such that at least one of the second upper electrodes is in contact with the contact.

It is to be understood that both the foregoing general description and the following detailed description of the embodiments are exemplary and explanatory and are intended to provide further explanation of the embodiments as claimed.

DRAWINGS

DESCRIPTION

FIGS. 2 to 13 illustrate sections illustrating example steps for manufacturing a semiconductor device, in accordance with embodiments. For example, embodiments may relate to manufacturing an MEM (Micro Metal Sphere) switch.

Figure 2:
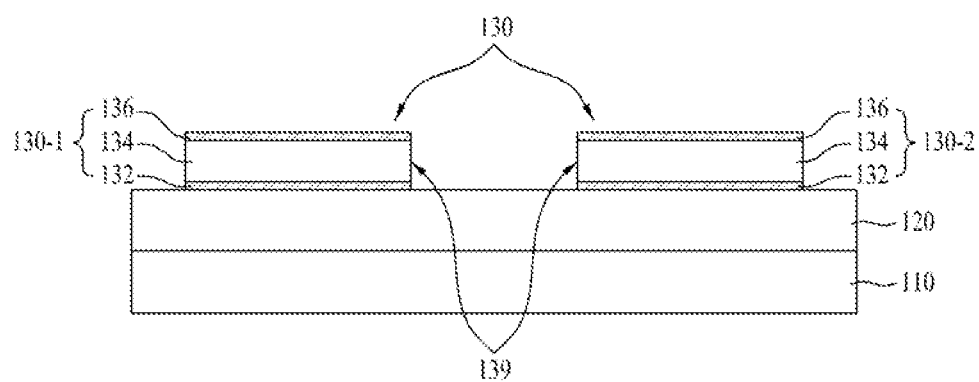
FIGS. 2 to 13 illustrate sections illustrating example steps of a method of manufacturing a semiconductor device, in accordance embodiments.

FIG. 2 illustrates an insulating layer 120 formed on/over a substrate 110, in accordance with embodiments. The substrate 110 may be a mono-crystalline silicon substrate, a poly-crystalline silicon substrate, a semiconductor substrate, and/or similar, in accordance with embodiments. The substrate 110 may have a device isolation film formed thereon which may divide an active region and a device isolation region. The substrate 110 may have p type impurities or n type impurities doped.

The insulating layer 120 may include at least one of oxide or nitride and/or may be single or multi-layered. For example, the insulating layer 120 may be deposited on/over the substrate by CVD (Chemical Vapor Deposition) and/or may include at least one of SiO2, SixNy (where, x, and y are real numbers), FSG (Fluoro Silicate glass), USG (Undoped Silicate Glass), BPSG (Boron Phospho Silicate Glass), TEOS (TetraEthOxySilane), and/or similar.

In embodiments, a lower electrode pattern 130 may be formed on/over the insulating layer 120. The lower electrode pattern 130 may have a stack structure including at least one of a first barrier layer 132, a first main electrode layer 134, and/or a second barrier layer 136. The first barrier layer 132 and the second barrier layer 136 may substantially preventing metal ions from diffusing from the first main electrode layer 134 to other layers (e.g. the insulating layer 120).

In embodiments, the first and the second barrier layers 132 and 136 may be formed of a material which blocks diffusion of the metal ions (e.g. TiN, Ti, a TiN/Ti alloy, and/or similar). The first main electrode layer 134 may be formed of a material having relatively good conductivity (e.g. Al, Au, Cu, an Al—Cu alloy, and/or similar).

In embodiments, the lower electrode pattern 130 may include a plurality of lower electrodes (e.g. 130-1 and 130-2) spaced apart from one another and/or electrically isolated from one another. For example, the lower electrode pattern 130 may include a first lower electrode 130-1 and a second lower electrode 130-2 spaced apart from and electrically isolated from each other. Although FIG. 2 only illustrates two lower electrodes 130-1 and 130-2, any practical number of the lower electrodes may be implemented in embodiments (i.e. three or more lower electrodes).

For example, the first barrier layer 132, the first main electrode layer 134, and/or the second barrier layer 136 may be deposited on/over the insulating layer 120 in succession by CVD (Chemical Vapor Deposition). These layers 132, 134, and 136 may then be patterned by photolithography and/or etching, which may result in formation of a plurality of lower electrodes (e.g. 130-1 and 130-2), in accordance with embodiments.

Referring to FIG. 2, the patterning by the photolithography and etching may expose or open sides of the first main electrode layers 134 of the first lower electrode 130-1 and the second lower electrode 130-2 from the first and second barrier layers 132 and 136, in accordance with embodiments. In embodiments, the patterning by photolithography and/or etching may expose and/or open a portion of the insulating layer 120 (e.g. a portion of an upper side of the insulating layer 120).

Figure 3:
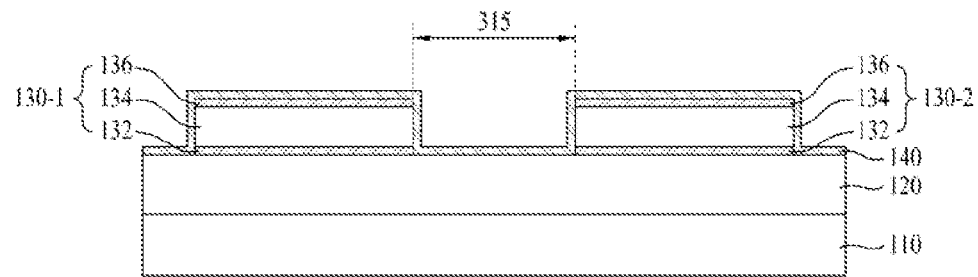

Referring to FIG. 3, an first stop film 140 may be formed on/over the insulating layer 120 to cover the lower electrode pattern 130, in accordance with embodiments. For example, the first stop film 140 may be deposited on/over an upper side and a side of each of the plurality of lower electrodes (e.g. 130-1, and 130-2) and the exposed portion of the insulating layer 120.

Since the first stop film 140 has a thickness less than the lower electrode pattern 130, the first stop film 140 may not completely fill a space 315 between the lower electrodes (e.g. 130-1 and 130-2). In embodiments, at least a portion of each of the first stop film 140 positioned on a side of each of the lower electrodes (e.g. 130-1 and 130-2) may be formed spaced apart from one another.

In embodiments, the lower electrode pattern 130 may have a thickness between approximately 1000 Å and 0.7 μm. In embodiments, the first stop film 140 may have a thickness below approximately 500 Å. The first stop film 140 may be formed of a material having an etch selectivity higher than interlayer insulating layers 150 and 180 (e.g. nitride SiN).

Figure 4:
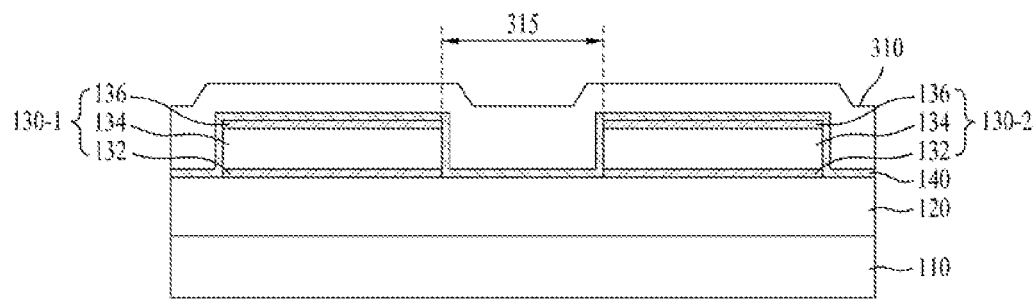

Referring to FIG. 4, a filling layer 310 may be formed on the first stop film 140, in accordance with embodiments. For example, an insulating material layer 310 may be formed on/over the first stop film 140 by CVD (Chemical Vapor Deposition) or HDP (High Density Plasma) CVD. The insulating material layer 310 may be, for an example, an oxide layer.

For example, the insulating material layer 310 may include at least one of, but not limited to SiO2, FSG (Fluoro Silicate glass), USG (Undoped Silicate Glass), BPSG (Boron Phospho Silicate Glass), and/or TEOS (TetraEthOxySilane). The insulating material layer 310 may be formed to fill a space 315 between the lower electrodes 130-1, and 130-2. The insulating material layer 310 may have a thickness of between approximately 0.75μ and 0.85 μm, in accordance with embodiments. The insulating material layer 310 may have an upper side formed higher than an upper side of the first stop film 140 positioned on/over the lower electrodes 130-1, and 130-2. The upper side of the insulating material layer 310 may have unevenness with convex and concave portions, because the insulating material layer 310 may be formed on/over the lower electrode pattern 130.

Figure 5:
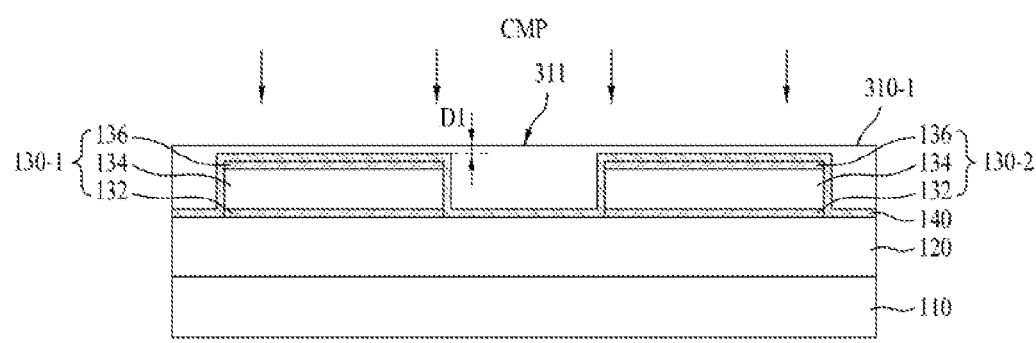

Referring to FIG. 5, a surface of the insulating material layer 310 deposited may be planarized by CMP (Chemical Mechanical Polishing) to form an insulating material layer 310-1. The first stop film 140 positioned on/over the lower electrode pattern 130 may not be exposed by the CMP, which may prevent the first stop film 140 from being damaged or lost by a CMP process.

For example, a distance D1 may be between approximately 0.25 μm and 0.35 μm, which may be based on the first stop film 140 positioned on/over the upper side of the lower electrodes (e.g. 130-1, and 130-2) to the upper side 311 of the planarized insulating material layer 310-1.

Figure 6:
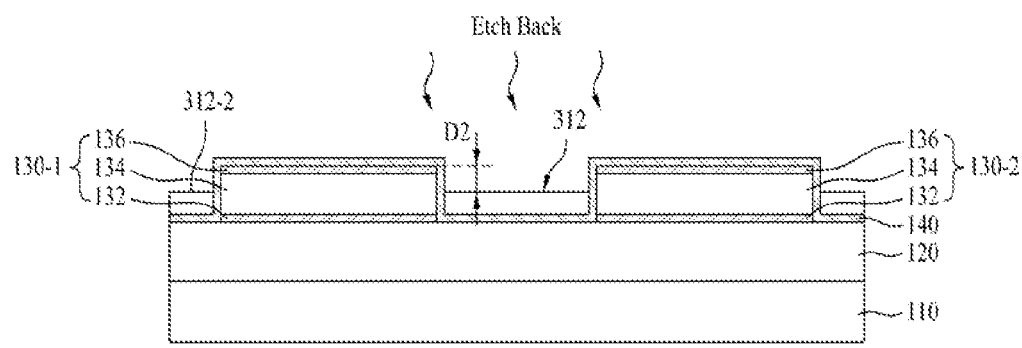

Referring to FIG. 6, the planarized insulating material layer 310-1 may be etched to form a filling layer 310-2 which may expose the first stop film 140 positioned on/over the upper side of the lower electrode pattern 130, in accordance with embodiments. For example, the planarized insulating material layer 310-1 may be etched back to expose a portion of the first stop film 140 positioned on/over the upper side of each of the lower electrodes (e.g. 130-1, and 130-2).

In embodiments, the upper side 312 of the filling layer 310-2 may be positioned at a height lower or at the same height as the upper side of the lower electrode pattern 130. In embodiments, the upper side of the lower electrode pattern 130 may be the upper side of the second barrier layer 136.

A distance D2 from the upper side of the lower electrode pattern 130 to the upper side 312 of the filling layer 310-2 may be between approximately 0 and 0.4 µm, in accordance with embodiments. If lower than the upper side of the lower electrode pattern 130, the upper side 312 of the filling layer 310-2 may also expose a portion of the first stop film 140 positioned at an upper side of the side of the lower electrode pattern 130 adjacent to the upper side of the lower electrode pattern 130 by etch back, in accordance with embodiments.

Figure 7:
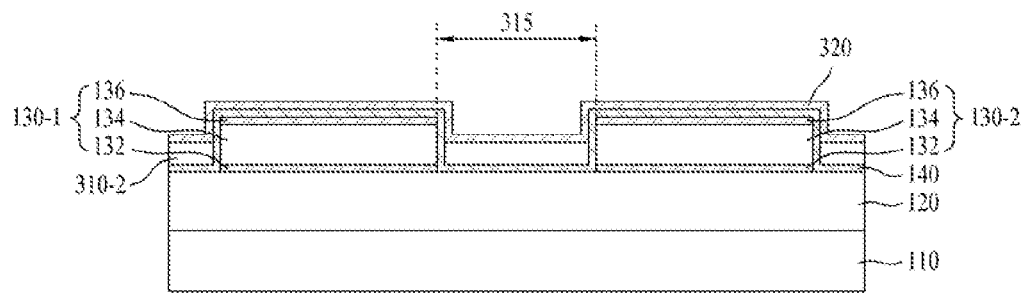
Figure 11:
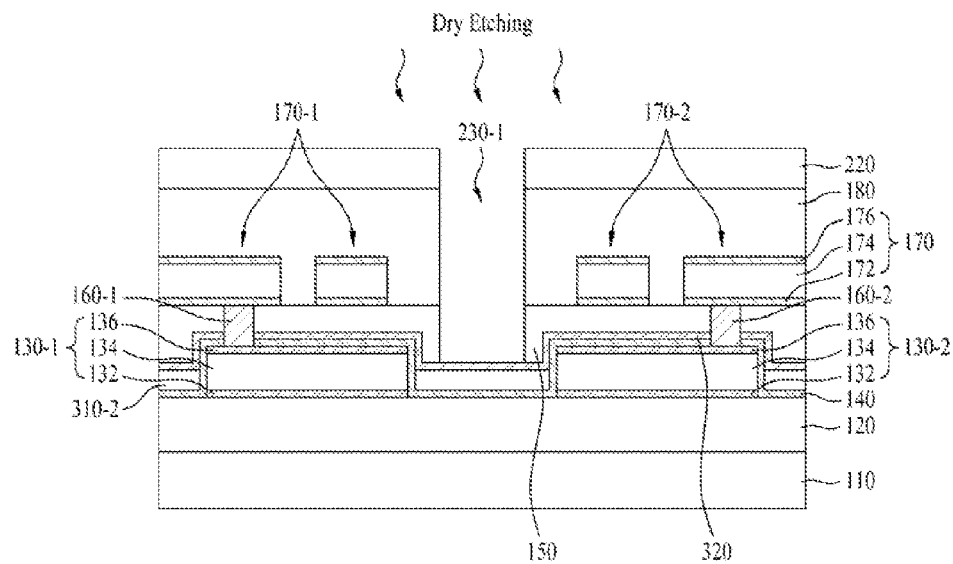
Figure 12:
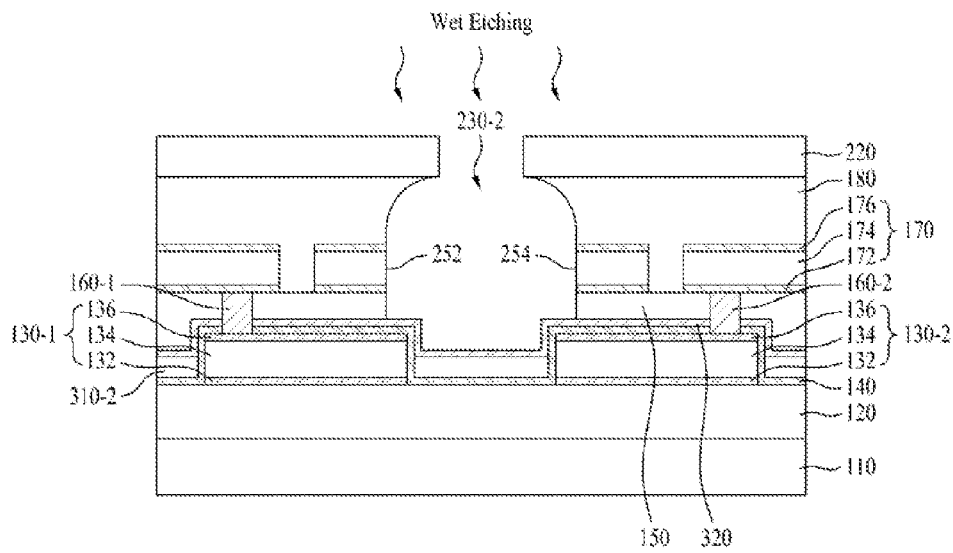

Referring to FIG. 7, a second stop film 320 may be formed on the first stop film 140 exposed by the filling layer 310-2 and the etch back, in accordance with embodiments. In embodiments, the second stop film 320 may serve as an etch stop film at the time of etching as illustrated in FIGS. 11 and 12 for forming a cavity 230-2 having a contact ball shown in FIG. 13 positioned therein.

The second stop film 320 may have a thickness that is determined based on the respective etch selectivities of the first and second interlayer insulating layers 150 and 180 and the conductance between the lower electrode pattern 130 and the contact ball, in accordance with embodiments. For example, the thickness of the second stop film 320 may be below approximately 0.1 µm.

Figure 8:
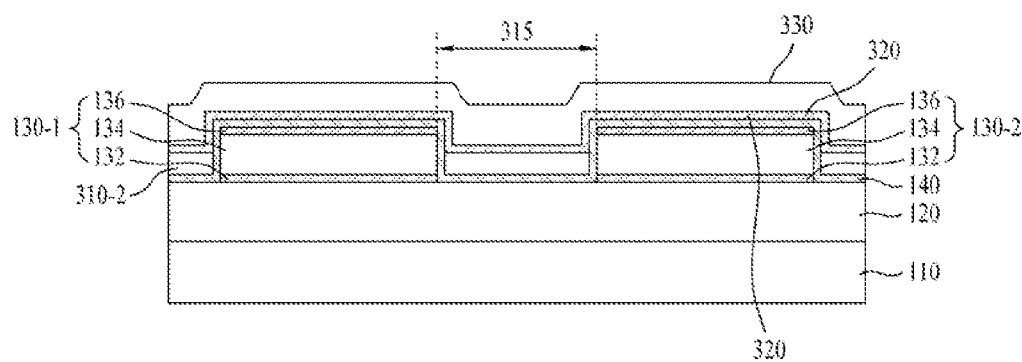

Referring to FIG. 8, an insulating material layer 330 is formed on the second stop film 320, in accordance with embodiments. For example, the insulating material layer 330 may be formed on the second stop film 320 by HDP (high density plasma) CVD and the insulating material layer 330 may include oxide (e.g. at least one of SiO2, FSG (Fluoro Silicate glass), USG (Undoped Silicate Glass), BPSG (Boron Phospho Silicate Glass), TEOS (TetraEthOxySilane), and/or similar). The insulating material layer formed may have a thickness of approximately 0.5 µm~0.7 µm, in accordance with embodiments.

Figure 9:
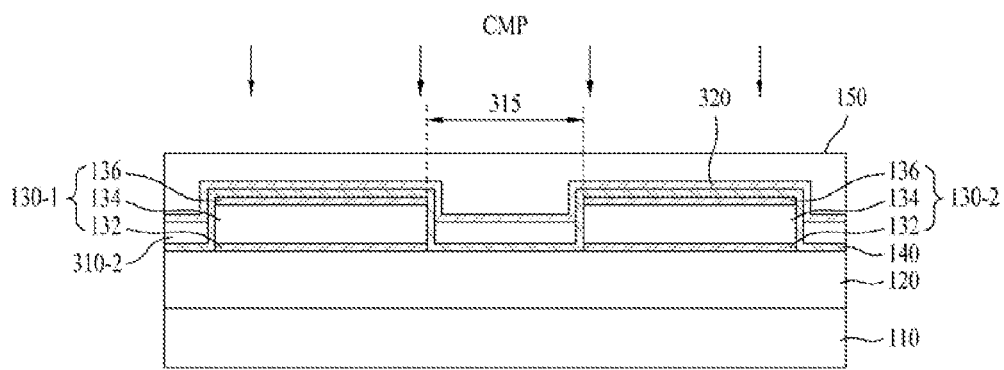

Referring to FIG. 9, the insulating material layer 330 may be planarized by CMP to form the first interlayer insulating film 150, in accordance with embodiments. The CMP may not expose the second stop film 320, in embodiments. The first interlayer insulating film 150 may have a thickness between approximately 0.35 µm and 0.45 µm.

In embodiments, it may be required that a stop film 119 fully covers a space 315 between the lower electrodes (e.g. 130-1, and 130-2) in order to make the stop film 119 to serve as an etch stop film in the etching described with reference to FIGS. 11 and 12. However, shortage of a gap fill margin may be from a large aspect ratio of the space 315 between the lower electrodes 130-1 and 130-2 that may cause a void to be formed in a deposited stop film 119. Note that the space 315 between the lower electrodes (e.g. 130-1 and 130-2) in which the contact ball 240 is to be formed is shown relatively large for convenience of illustration in FIGS. 2 through 13. However, in embodiments, the contact ball 240 may be a nano-sized and the size of the space 315 may be relatively small. Accordingly, in embodiments, the aspect ratio of the space 315 between the lower electrodes (e.g. 130-1 and 130-2) may be relatively large, in accordance with embodiments.

Figure 20:
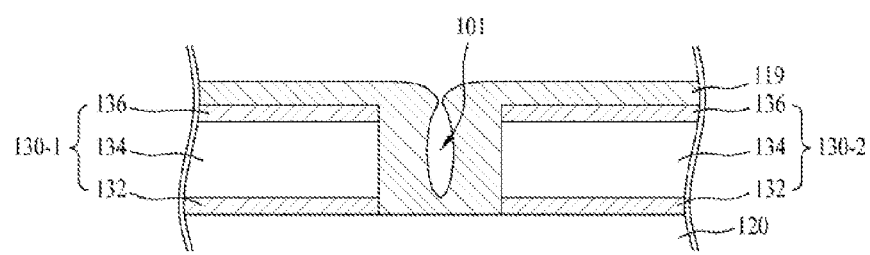
FIG. 20 illustrates a void formed in a gap filled stop film in a space between lower electrodes, in accordance with embodiments.

FIG. 20 illustrates a void formed in a gap filled stop film in a space between the lower electrodes 130-1 and 130-2, in accordance with embodiments. As illustrated in FIG. 20, since the deposited stop film 119 may fail to make full coverage of the space 315 between the lower electrodes (e.g. 130-1 and 130-2), a void 101 may be formed. The void 101 may cause damage and/or loss of the lower electrode pattern 130 in the etching (e.g. the etching described in FIGS. 11 and 12), which may result in relatively poor reliability and relatively low manufacturing yield.

However, in embodiments illustrated in FIGS. 3 through 7, embodiments may suppress the formation of the void 101 between the lower electrodes (e.g. 130-1 and 130-2) by depositing a thin stop film 140 to reduce the aspect ratio of the space 315 between the lower electrodes (e.g. 130-1 and 130-2) and/or by depositing the second stop film 320 after making gap fill in the space 315 between the lower electrodes (e.g. 130-1 and 130-2) which may result in the aspect ratio being substantially minimized with respect to the insulating material layer 310. Accordingly, embodiments may substantially prevent or minimize the impact of the lower electrode pattern 130 from being damaged and/or lost by the second etching to maintain the reliability of the semiconductor device and to prevent yield of the semiconductor device from being unnecessarily deteriorated.

Figure 10:
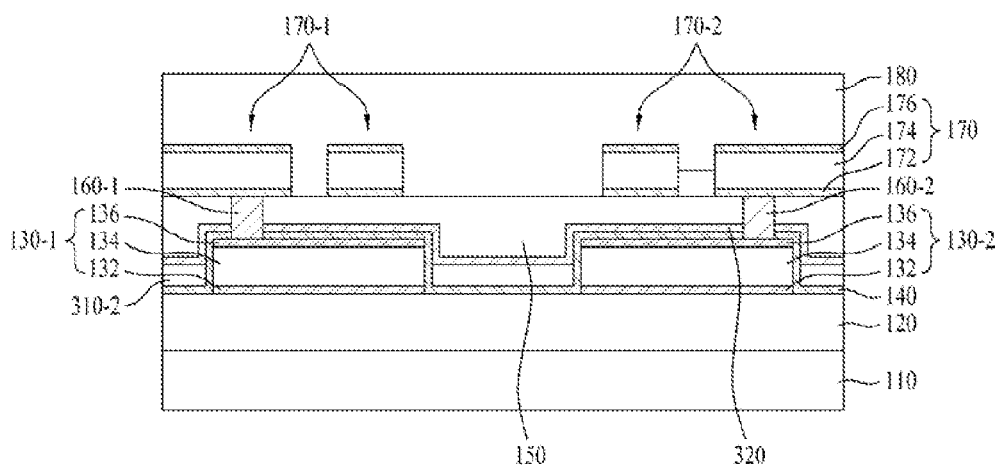

Embodiment may adjust the thickness of the first stop film 140 and/or the second stop film 320 according to the thickness of the insulating material layer 310 owing to the gap fill with the insulating material layer 310. Embodiment may improve or adjust the conductance which can take place between the lower electrode pattern 130 and the contact ball 240 owing to the thickness adjustments of the second stop film 320, in accordance with embodiments. Referring to FIG. 10, a plurality of contacts 160 may be formed, which may be in contact with the upper side of the lower electrode pattern 130 that pass through the first interlayer insulating layer 150, the second stop film 320, and the first stop film 140, in accordance with embodiments. The contact (e.g. 160-1 or 160-2) may be in contact with the upper side of one of the lower electrodes (e.g. 130-1 and 130-2) passed through a region of each of the first interlayer insulating layer 150, the second stop film 320, and the first stop film 140 may be formed. For example, the first contact 160-1 may be in contact with the upper side of the first lower electrode 130-1 and/or the second contact 160-2 may be in contact with the upper side of the second lower electrode 130-2. Although FIG. 10 only illustrates two contacts, the number of contacts is not limited to this example, in accordance with embodiments. In embodiments, there may be three or more contacts. In embodiments, at least one contact may be formed to be in contact with each of the plurality of the lower electrodes (e.g. 130-1 and 130-2).

In embodiments, one example method of forming contact 160 may include at least one of the following steps: (1) A photoresist pattern may be formed on/over the first interlayer insulating layer 150. (2) The first interlayer insulating layer 150, the second stop film 320, and the first stop film 140 may be etched using the photoresist pattern as an etch mask in succession to form a via hole. (3) A conductive material (e.g. tungsten) may be filled in the formed via hole and planarized, to form the contact 160. In accordance with embodiments, other methods for forming the contact 160 may be used and embodiments are not limited to these steps.

In embodiments, an upper electrode pattern 170 may be formed on/over the first interlayer insulating layer 150. The upper electrode pattern 170 may have a structure having a stack of a third barrier layer 172, a second main electrode layer 174, and a fourth barrier layer 176. The third barrier layer 172, and the fourth barrier layer 176 serve to substantially prevent metal ions of the second main electrode layer 174 from diffusing to other layers (e.g. the first and second interlayer insulating layers 150 and 180).

In embodiments, the third and fourth barrier layers 172 and 176 may be formed of a barrier metal material (e.g. TiN, Ti, a TiN/Ti alloy, and/or similar). The second main electrode layer 174 may be formed of a material having relatively good conductivity (e.g. Al, Au, Cu, an Al—Cu alloy, and/or similar).

In embodiments, the upper electrode pattern 170 may include a plurality of upper electrodes (e.g. 170-1 and 170-2) spaced apart from one another and substantially electrically isolated from one another. For example, the upper electrode pattern 170 may include the first upper electrode 170-1 and the second upper electrode 170-2.

For example, by depositing the third barrier layer 172, the second main electrode layer 174, and the fourth barrier layer 176 on/over the first interlayer insulating layer 150 by CVD (Chemical Vapor Deposition) in succession and patterning the deposited layers 172, 174, and 176 by photolithography and/or etching, the plurality of the upper electrodes (e.g. 170-1 and 170-2) may be formed to be spaced apart from one another. In embodiments, the patterning by photolithography and/or etching may expose sides of the plurality of the upper electrodes (e.g. 170-1 and 170-2). For example, sides 149-1 and 149-2 of the second main electrode layers 174 in the plurality of the upper electrodes (e.g. 170-1 and 170-2) may be exposed or opened from the third or fourth barrier layers 172 and 176. In embodiments, the patterning by photolithography and/or etching may expose and/or open a portion of the first interlayer insulating layer 150 (e.g. a portion of an upper side of the first interlayer insulating layer 150).

In embodiments, the upper electrode pattern 170 may be electrically connected to the lower electrode pattern 130 with the contact 160. For example, the first upper electrode 170-1 may be electrically connected to the first contact 160-1 and/or the second upper electrode 170-2 may be electrically connected to the second contact 160-2.

In embodiments, at least one of the plurality of the upper electrodes (e.g. 170-1 and 170-2) may be positioned on/over the contact 160 and may be in contact to the contact 160. For example, a portion of the first upper electrode 170-1 may be positioned on/over the first contact 160-1 and may be in contact with the first contact 160-1. Similarly, for example, a portion of the second upper electrode 170-2 may be positioned on/over the second contact 160-2 and may be in contact with the second contact 160-2.

In embodiments, a second interlayer insulating layer 180 may be formed on/over the first interlayer insulating layer 150 to cover the upper electrode pattern 170. The second interlayer insulating layer 180 may be formed of a material and by a method similar with the first interlayer insulating layer 150, in accordance with embodiments.

Referring to FIG. 11, a photoresist pattern 220 may be formed on/over the second interlayer insulating layer 180 by photolithography, in accordance with embodiments. The photoresist pattern 220 may expose at least a portion of an upper side of the second interlayer insulating layer 180 positioned between the plurality of the upper electrodes (e.g. 170-1 and 170-2). For example, the photoresist pattern 220 may expose at least a portion of the upper side of the second interlayer insulating layer 180 positioned between the first upper electrode 170-1 and the second upper electrode 170-2.

In embodiments, a first etching is performed, in which the second interlayer insulating layer 180 and the first interlayer insulating layer 150 may be etched using the photoresist pattern 220 as an etch mask to form a hole 230-1 which exposes the second stop film 320. The first etching may be dry etching, in accordance with embodiments. The second stop film 320 may serve as an etch stop film in the first etching and the hole 230-1 may expose a portion of the second stop film 320, in accordance with embodiments.

Referring to FIG. 12, a second etching may be performed, in which the second interlayer insulating layer 180 and the first interlayer insulating layer 150 etched in the first etching may be etched by using the photoresist pattern 220 as an etch mask to form a cavity 230-2 which exposes at least a side of the upper electrode pattern 170, in accordance with embodiments. For example, the second etching may form a cavity 230-2 which exposes a first side 252 of the first upper electrode 170-1 and a first side 254 of the second upper electrode 170-2. The first side 252 of the first upper electrode 170-1 and the first side 254 of the second upper electrode 170-2 may be sides facing each other. The first sides 252 and 254 of the first upper electrode 170-1 and the second upper electrode 170-2 may include a side of each of the third barrier layer 172, the second main electrode layer 174, and the fourth barrier layer 176, respectively.

In embodiments, the cavity 230-2 may expose a portion of an upper side of the third barrier layer 172 adjacent to the first side 254 and a portion of an upper side of the fourth barrier layer 176. The second etching may be a wet etching using (for example) an etchant which is a mixture of DIW (DeIonized Water) mixed with an HF group chemical, in accordance with embodiments. In the second etching, the etchant may flow into the hole 230-1 to etch the second interlayer insulating layer 180 and the first interlayer insulating layer 150, in accordance with embodiments.

In embodiments, the second etching may include at least one of the following two exemplary steps: (1) The first step may include etching for approximately 1 to 20 minutes with DHF (Diluted HF) with an HF to H2O ratio of 1~1000:1. (2) The second step may include etching for approximately 1 to 20 minutes with BHF (Buffered HF) with an NH4F to HF ratio of 3~100:1.

In embodiments, the cavity 230-2 may expose the second stop film 320. The second stop film 320 may serve to substantially prevent the lower electrode pattern 130 from being damaged by the second etching, in accordance with embodiments.

Figure 13:
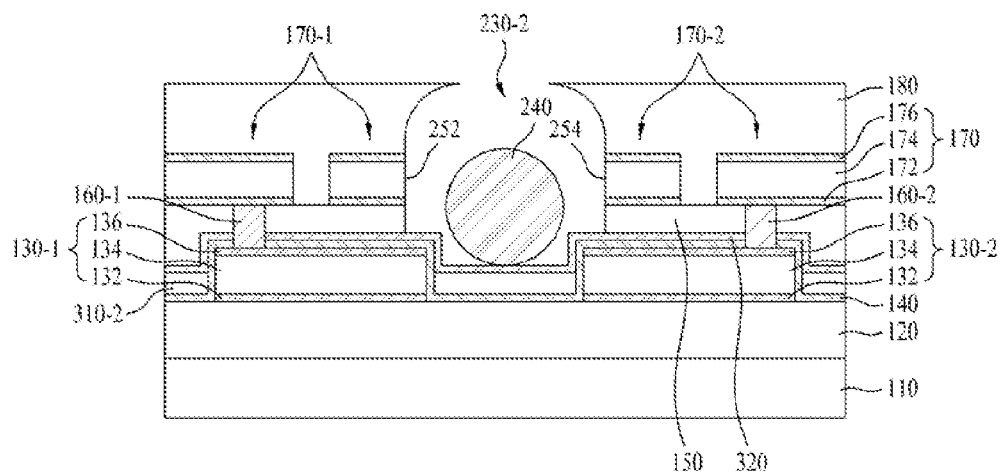

Referring to FIG. 13, a contact ball 240 may be formed on/over the second stop film 320 in the cavity 230-2, in accordance with embodiments. The contact ball 240 that may be formed may have a diameter smaller than a distance between the sides 252 and 254 of the upper electrodes (e.g. 170-1 and 170-2) exposed by the cavity 230-2, in accordance with embodiments.

In example embodiments, the contact ball 240 may be formed by at least one of the following steps: (1) A conductive material layer (e.g. a metal layer) may be formed on/over the second stop film 320 in the photoresist pattern 220 and the cavity 230-2 for forming the contact ball 240. (2) A lift-off may be performed to remove the photoresist pattern 220 and the conductive material layer positioned thereon, altogether. The lift-off may not remove the conductive material layer positioned on/over the second stop film 320 in the cavity 230-2 which may leave a portion of the conductive material on/over the second stop film 320 in the cavity 230-2. (3) The portion of the conductive material remaining in the cavity 230-2 may be subjected to annealing to form the contact ball 240 on the second stop film 320 in the cavity 230-2. The cavity 230-2 may form an air void. As the contact ball 240 is brought into contact with any one of the sides 252 and 254 of the upper electrodes (e.g. 170-1 and 170-2), the semiconductor device may perform a switching operation.

Figure 1:
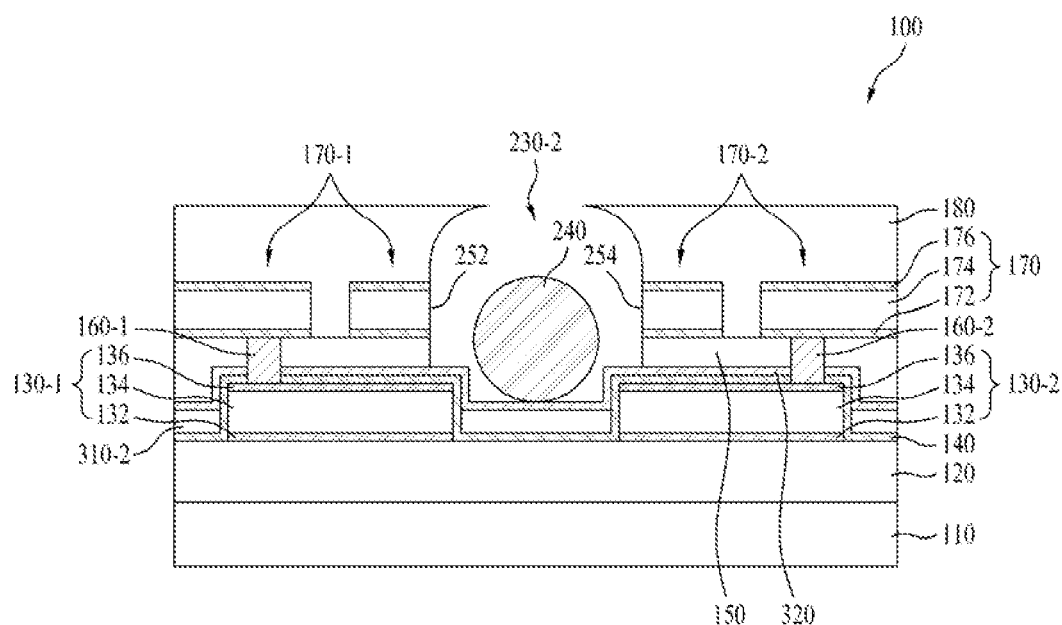
FIG. 1 illustrates a section of a semiconductor device, in accordance with embodiments.

FIG. 1 illustrates a section of a semiconductor device 100, in accordance with embodiments. The semiconductor device 100 may be a Micro Metal Sphere switch, in accordance with embodiments. The semiconductor device 100 may include at least one of a substrate 110, an insulating layer 120, a lower electrode pattern 130, a first stop film 140, a filling layer 310-2, a second stop film 320, a first interlayer insulating layer 150, contacts 160-1 and 160-2, an upper electrode pattern 170, a second interlayer insulating layer 180, a cavity 230-2, and/or a contact ball 240.

The insulating layer 120 may be formed on/over the substrate 110. The lower electrode pattern 130 (See FIG. 2) may include lower electrodes 130-1 and 130-2 formed on/over the insulating layer 120 spaced apart from each other.

The first stop film 140 may be formed on/over the lower electrodes 130-1, and 130-2 and the insulating layer 120. In embodiments, a portion of the first stop film 140 is positioned on/over a side of both the lower electrodes 130-1 and 130-2, which may be spaced apart from each other. For example, the portion of the first stop film 140 positioned on/over the side of the first lower electrode 130-1 may not be in contact with the other portion of the first stop film 140 positioned on the side of the second lower electrode 130-2, but may be spaced apart in which a filling layer 310-2 may be arranged.

The filling layer 310-2 may be formed on/over the first stop film 140 positioned between the lower electrodes 130-1 and 130-2. The filling layer 310-2 may have an upper side having a height lower than or substantially same height as an upper side of the lower electrodes 130-1 and 130-2, in accordance with embodiments. The second stop film 320 may be formed on/over the filling layer 310-2 and/or the first stop film 140. The first interlayer insulating layer 150 may be formed on/over the second stop film 320. The contacts 160-1 and 160-2 may be in contact with the upper sides of the lower electrodes 130-1 and 130-2 which pass through the first interlayer insulating layer 150, the second stop film 320, and/or the first stop film 140, in accordance with embodiments. The upper electrode pattern 170 may be formed on/over the first interlayer insulating layer 150 and may include a plurality of upper electrodes 170-1 and 170-2 spaced apart from one another. At least one of the upper electrodes 170-1 and/or 170-2 may be in contact with the contacts 160-1, or 160-2. The second interlayer insulating layer 180 may be formed on/over the upper electrodes 170-1 and 170-2.

The cavity 230-2 may be formed in the second interlayer insulating layer 180 and the first interlayer insulating layer 150 to expose a side 252 or 254 of at least one of the upper electrodes 170-1 and 170-2 and the second stop film 320. The cavity 230-2 may expose the first side of the first upper electrode 170-1 and the first side 254 of the second upper electrode 170-2. The first upper electrode 170-1 and the second upper electrode 170-2 may be adjacent to each other and the first side 252 of the first upper electrode 170-1 and the first side 254 of the second upper electrode 170-2 may have sides facing each other. The contact ball 240 may be formed on/over the second stop film 320 exposed by the cavity 230-2.

Figure 15:
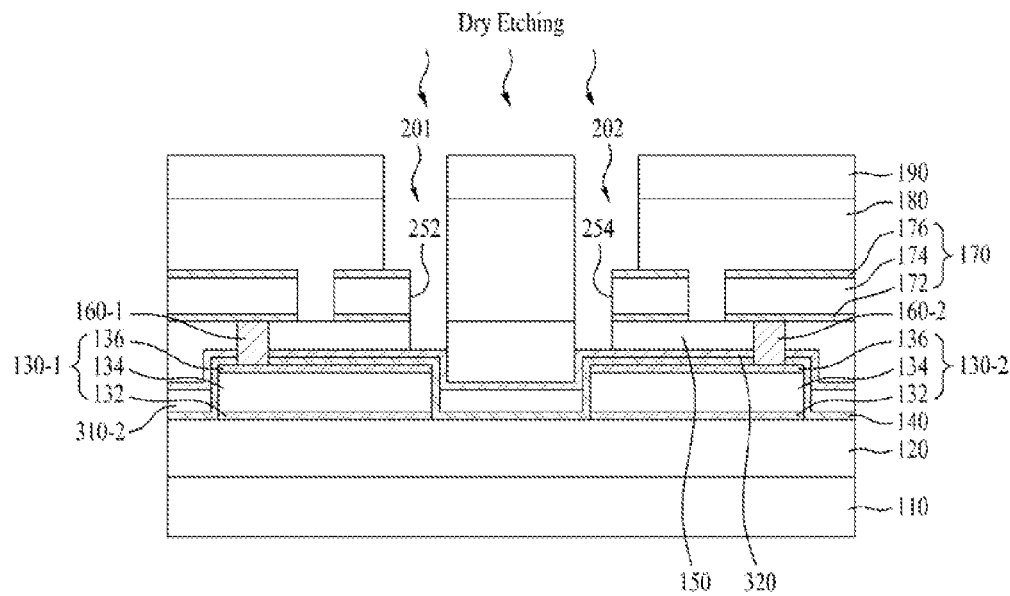
FIGS. 15 to 19 illustrate sections illustrating example steps of a method of manufacturing a semiconductor device, in accordance with embodiments.

FIGS. 15 to 19 illustrate sections illustrating exemplary steps of a method of manufacturing a semiconductor device in accordance with embodiments. Referring to FIG. 15, for the purposes of explanation, previous steps may be substantially the same as illustrated in FIGS. 2 through 10. As illustrated in FIG. 15, a plurality of trenches (e.g. 201 and 202) are formed to expose sides of the plurality of the upper electrodes (e.g. 170-1 and 170-2). The trenches (e.g. 201, and 202) may expose portions of upper sides of the upper electrodes (e.g. 170-1 and 170-2) adjacent to the exposed sides 252 and 254 of the upper electrodes (e.g. 170-1 and 170-2), in accordance with embodiments.

The trenches 201 and 202 which may respectively expose the side 252 of the first upper electrode 170-1 and the first side 254 of the second upper electrode 170-2 may be formed in the second interlayer insulating layer 180 and the first interlayer insulating layer 150, in accordance with embodiments. The number of the trenches 201 and 202 may be the same or greater than the number of the upper electrodes. A photoresist pattern 190 may be formed on/over the second interlayer insulating layer 180 by photolithography when forming the trenches 201 and 202.

In embodiments, a step for etching the second interlayer insulating layer 180 (i.e. "a trench forming etching step") may be performed using the photoresist pattern 190 as an etch mask to form the first trench 201 which exposes the side 252 of the first upper electrode 170-1 and the second trench 202 which exposes the side 254 of the second upper electrode 170-2. The trench forming etching step may expose a portion of the upper side of the first upper electrode 170-1 adjacent to the side 252 of the first upper electrode 170-1 and a portion of the upper side of the second upper electrode 170-2 adjacent to the side 254 of the second upper electrode 170-2. In embodiments, the first trench 201 may expose a portion of the upper side of the first upper electrode 170-1 adjacent to the side 252 of the exposed first upper electrode 170-1. The second trench 202 may expose a portion of the upper side of the second upper electrode 170-2 adjacent to the side 254 of the exposed second upper electrode 170-2.

In embodiments, the trench forming etching step may etch not only the second interlayer insulating layer 180, but also the first interlayer insulating layer 150. The etching may be stopped when the second stop film 320 is exposed and the plurality of trenches (e.g. 201 and 202) expose the second stop film 320. In embodiments, the second stop film 320 may serve as an etch stop film of the etching performed when forming the trenches.

For example, the trenches 201 and 202 may respectively expose the sides 252 and 254 of the first upper electrode 170-1 and the second upper electrode 170-2 which face or are opposite to the cavity 230-2 having a contact ball. In embodiments, the sides 252 and 254 of the first upper electrode 170-1 and the second upper electrode 170-2 may be exposed and may be sides facing each other.

In embodiments, the first trench 201 may expose a side of the second main electrode layer 174 of the first upper electrode 170-1, and the second trench 202 may expose a side of the second main electrode layer 174 of the second upper electrode 170-2. In embodiments, the first trench 201 may expose a portion of an upper side of the fourth barrier layer 176 of the first upper electrode 170-1 adjacent to the side of the second main electrode layer 174 of the exposed first upper electrode 170-1. The second trench 202 may expose a portion of an upper side of the fourth barrier layer 176 of the second upper electrode 170-2 adjacent to the side the second main electrode layer 174 of the exposed second upper electrode 170-2. In embodiments, a portion of each of the fourth barrier layer 176 and the main electrode layer 174 of the first upper electrode 170-1 and the second upper electrode 170-2 that may be exposed in the trench forming etching step may be etched and removed.

Figure 16:
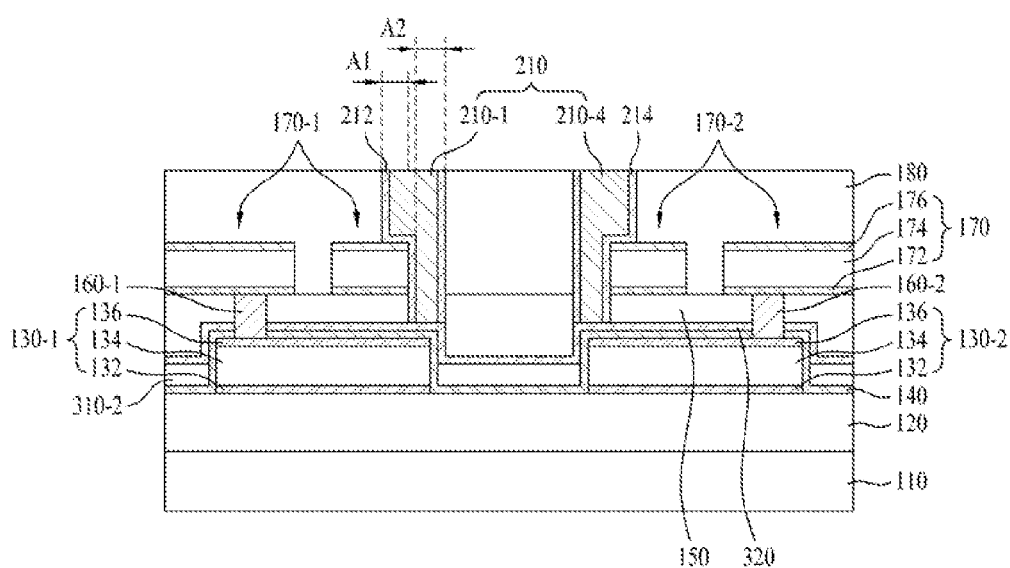

Referring to FIG. 16, by removing remained photoresist pattern 190 and filling a conductive material in the trenches 201 and 202, an etch blocking layer 210 may be formed, in accordance with embodiments. The photoresist pattern 190 may be removed by ashing or striping.

The etch blocking layer 210 may be formed in each of the plurality of trenches (e.g. 201 and 202). The etch blocking layer 210 may be positioned on the side (e.g. 252 or 254) of each of the upper electrodes (e.g. 170-1 and 170-2). In embodiments, the etch blocking layer 210 may also be positioned on/over a portion of an upper side of each of the upper electrodes 170-1 and 170-2 adjacent to the side (e.g. 252 or 254). In embodiments, the etch blocking layer 210 may cover the sides 252 and 254 and the portions of the upper sides of the upper electrodes 170-1 and 170-2 adjacent to the sides (e.g. 252 and 254).

The etch blocking layers (e.g. 210-1 and 210-2) may be positioned on/over the sides (e.g. 252 and 254) of the plurality of upper electrodes (e.g. 170-1 and 170-2) and may be spaced apart from one another. However, other embodiments are not limited to this configuration. In embodiments, a structure of the etch blocking layer may be determined based on a shape of the upper electrode pattern 170. In embodiments, at least one of the plurality of the etch blocking layers may be positioned on/over the sides of the upper electrodes different from one another may be connected to each other.

The etch blocking layer 210 may include a first portion A1 overlapped with the upper electrodes (e.g. 170-1 and 170-2) in a vertical direction and a second portion A2 which may not overlap with the upper electrodes (e.g. 170-1 and 170-2) in the vertical direction. The first portion A1 and the second portion A2 may be in contact with each other and/or may be one unit. If the trenches (e.g. 201 and 202) expose the second stop film 320 passed through the first interlayer insulating layer 150, an underside of the etch blocking layer 210 may be in contact with the second stop film 320.

The etch blocking layer 210 may be formed of a conductive material having etch selectivity higher than the first and second interlayer insulating layers 150, and 180 (e.g. tungsten). In order to prevent metal ions of the etch blocking layers 210-1 and 210-2 from diffusing to the interlayer insulating layers 150 and 180, a barrier layer 212 or 214 may be formed between the etch blocking layer 210-1 or 210-2 and the trench 201 or 202.

For example, in embodiments, the etch blocking layers 210-1 and 210-2 and the barrier layers 212 and 214 may be formed by at least one of the following steps: (1) A barrier material and an etch blocking material may be deposited on/over the second interlayer insulating layer 180 in succession to fill the trenches 201 and 202 by using CVD. (2) Planarizing the etch blocking material and the barrier metal material formed on the second interlayer insulating layer 180.

In embodiments, the barrier metal material may be deposited having a thickness of between approximately 50 Å and 200 Å. The barrier metal material may be the same material as the first to fourth barrier layers 132, 136, 172, and 176, in accordance with embodiments. In embodiments, the etch blocking material may include tungsten, may be a conductive material having etch selectivity higher than the first and second interlayer insulating layers 150 and 180, and/or similar.

According to embodiments, to expose an upper surface of the second interlayer insulating layer 180, and the etch blocking layers 210-1 and 210-2, the barrier layers 212 and 214 may be formed in the trenches 201 and 202.

Figure 17:
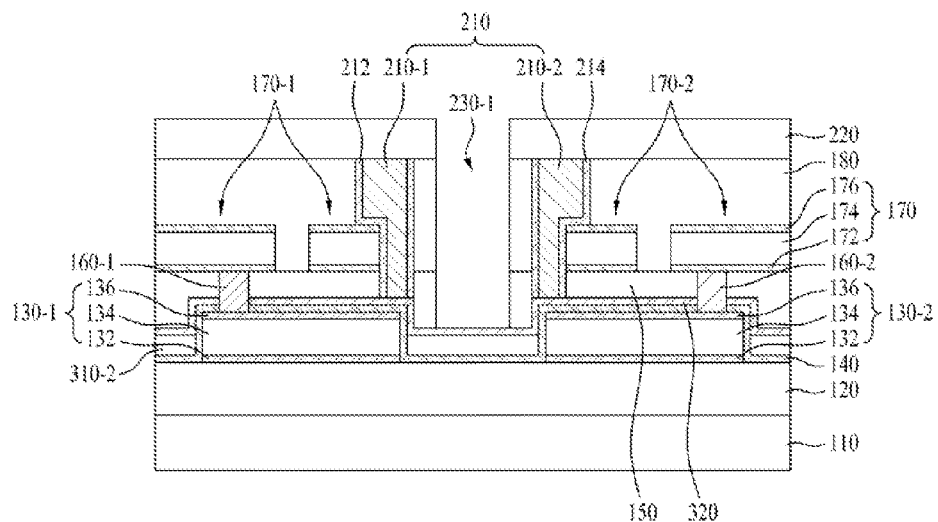

Referring to FIG. 17, a photoresist pattern 220 may be formed on/over the second interlayer insulating layer 180 by photolithography, in accordance with embodiments. The photoresist pattern 220 may expose at least a portion of an upper side of the second interlayer insulating layer 180 positioned between the etch blocking layers (e.g. 210-1 and 210-2). In embodiments, a first etching is performed, in which the second interlayer insulating layer 180 and/or the first interlayer insulating layer 150 may be etched using the photoresist pattern 220 as a mask to form a hole 230-1 which exposes the second stop film 320.

Figure 18:
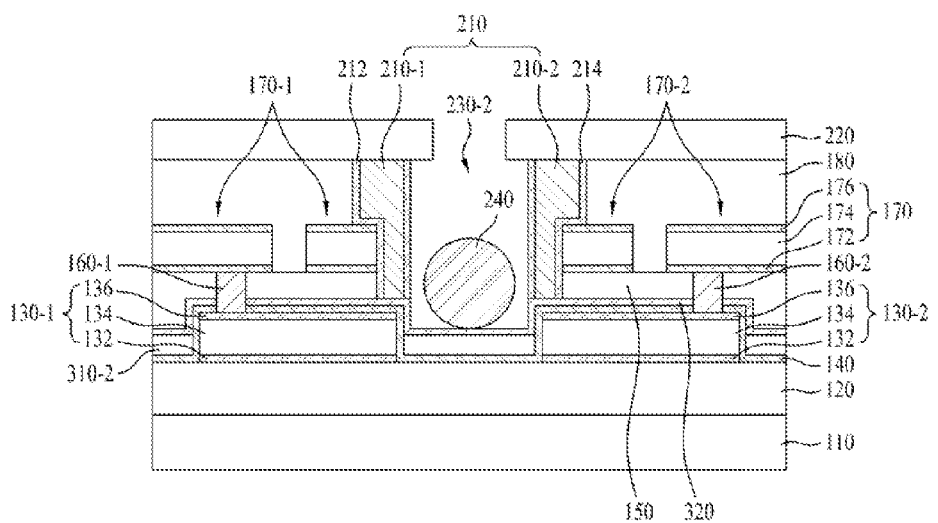

Referring to FIG. 18, a second etching may be performed, in which the second interlayer insulating layer 180 and/or the first interlayer insulating layer 150 etched in the first etching may be etched by using the photoresist pattern 220 as an etch mask to form a cavity 230-2, which may expose the etch blocking layers 210-1 and 210-2, in accordance with embodiments. In embodiments, the second etching may be substantially the same as illustrated in the embodiments associated with FIG. 12.

The etch blocking layers 210-1 and 210-2 may serve to protect the first upper electrode 170-1 and the second upper electrode 170-2 from the second etching. Since the etch blocking layers 210-1 and 210-2 may have an etch selectivity higher than the interlayer insulating layers 180 and 150 not to be etched in the second etching, the etch blocking layers 210-1 and 210-2 may protect the first upper electrode 170-1 and the second upper electrode 170-2 from the second etching.

An example material of the second main electrode layer 174 for at least one of the first upper electrode 170-1 and the second upper electrode 170-2 (e.g. Cu, Al, a Cu—Al alloy, and/or similar) may be susceptible to damage by the etchant in the second etching.

In embodiments where there is no etch blocking layers 210-1 and 210-2, the second interlayer insulating layer 180 and the first interlayer insulating layer 150 may be wet etched to expose a side and an upper side of each of the first upper electrode 170-1 and the second upper electrode 170-2 making the side of the main electrode layer 174 of both the first upper electrode 170-1 and the second upper electrode 170-2 to be susceptible to damage by the etchant in the second etching, which may cause malfunction of switching of the semiconductor device, thereby making reliability and yield of the semiconductor device not optimized.

However, by forming the etch blocking layers 210-1 or 210-2 of a material having etch selectivity higher than the first and second interlayer insulating layers 150 and 180 (e.g. which may be exposed to the second etching) to cover the side of the first upper electrode 170-1 or the second upper electrodes 170-2, embodiments may prevent the first upper electrode 170-1 and the second upper electrode 170-2 from being etched and damaged by the etchant in the second etching.

In embodiments, the formation of the upper electrode pattern 170 of a material substantially insensitive to the wet etching etchant for securing the cavity 230-2 having the contact ball positioned therein may enable to improve degrees of freedom of the upper electrode pattern 170, which may assure reliability of switching operations of the semiconductor device, and allow for the optimization of manufacturing yield.

Figure 19:
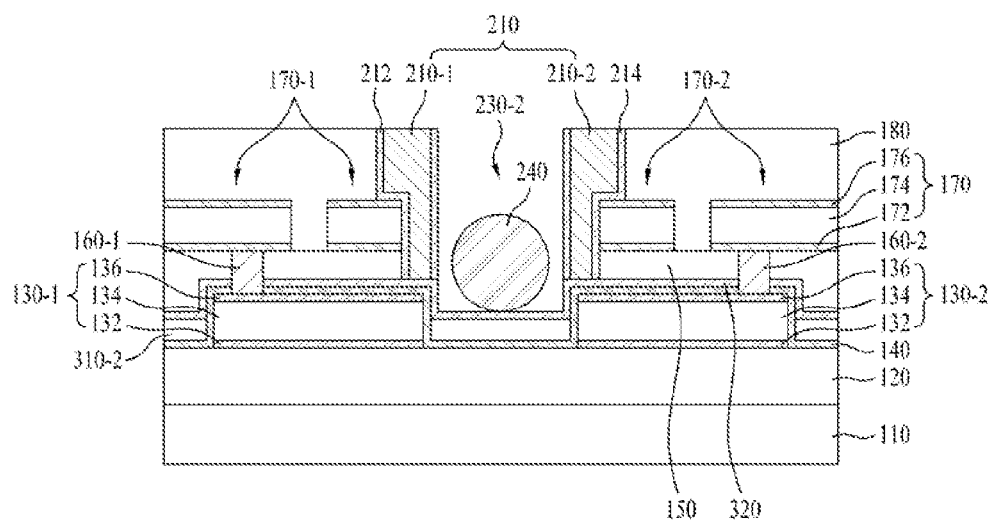

Referring to FIG. 19, remaining photoresist pattern 200 may be removed, and a contact ball 240 may be formed on the stop film 140 in the cavity 230-2, in accordance with embodiments. A method of forming the contact ball 240 may be substantially similar to the description made with reference to FIG. 13, in accordance with embodiments.

Figure 14:
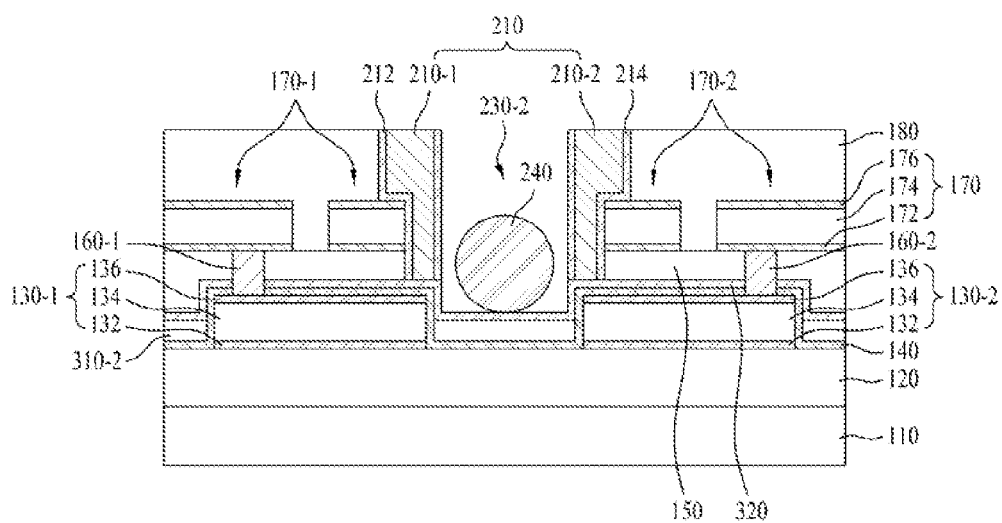
FIG. 14 illustrates a section of a semiconductor device, in accordance with embodiments.

FIG. 14 illustrates a semiconductor device 200 in accordance with embodiments. The semiconductor device 200 may include all the elements included to the semiconductor device 100 shown in FIG. 1 and may further includes etch blocking layers 210-1 and 210-2, in accordance with embodiments.

The etch blocking layers 210-1 and 210-2 may cover a side of at least one of the plurality of upper electrodes that passes through the second interlayer insulating layer 180 and the first interlayer insulating layer 150, in accordance with embodiments. For example, the first etch blocking layer 210-1 may cover one 252 (e.g. see FIG. 15) of the sides of the first upper electrode 170-1 and a portion of an upper side of the first upper electrode 170-1 adjacent to the side 252. In embodiments, the second etch blocking layer 210-2 may cover one 254 (e.g. see FIG. 15) of the sides of the second upper electrode 170-2 and a portion of an upper side of the second upper electrode 170-2 adjacent to the side 254. In embodiments, the cavity 230-2 shown in FIG. 19 may not expose the sides of the upper electrodes 170-1 and 170-2 and may expose a side of each of the etch blocking layers 210-1 and 210-2.

In embodiments, the Micro Metal Sphere switch and a method for manufacturing a Micro Metal Sphere switch have several advantages. For example, in embodiments, formation of a void between the lower electrodes may be substantially prevented. Accordingly, in embodiments, damage of the lower electrode pattern and the upper electrode pattern by the second etching may be prevented.

Characteristics, structures, effects, and so on described in above embodiments are included to at least one of the embodiments, but not limited to only one embodiment invariably. Furthermore, it is apparent that the features, the structures, the effects, and so on described in the embodiments can be combined, or modified with other embodiments by persons skilled in this field of art. Therefore, it is required to understand that such combination and modification is included to scope of the embodiments.

What is claimed is:

1. A method comprising:
   forming a plurality of lower electrodes over a substrate;
   forming a first stop film over the lower electrodes;
   forming a filling layer over the first stop film;
   forming a second stop film over the filling layer;
   forming a first interlayer insulating layer over the second stop film;
   forming a plurality of upper electrodes over the first interlayer insulating layer;
   forming a second interlayer insulating layer over the upper electrodes;
   etching the second interlayer insulating layer and the first interlayer insulating layer to form a cavity; and
   forming a contact ball in the cavity.

2. The method of claim 1, wherein said forming the first stop film comprises forming the first stop film on an upper side and a side of each of the plurality of lower electrodes, wherein the first stop film positioned on the side of each of the lower electrodes is spaced apart from other lower electrodes of the plurality of electrodes.

3. The method of claim 1, wherein the forming a filling layer comprises:
   forming the filling layer on the first stop film;
   planarizing the filling layer; and
   etching the planarized filling layer to expose at least a portion of the first stop film positioned over the upper side of the lower electrodes.

4. The method of claim 3, wherein the etched filling layer has an upper side with a height lower than or substantially the same height as the upper side of the lower electrodes.

5. The method of claim 1, wherein the etching the second interlayer insulating layer and the first interlayer insulating layer to form the cavity comprises exposing a side of at least one of the upper electrodes and the second stop film.

6. The method of claim 1, comprising forming an etch blocking layer which covers a side of at least one of the plurality of upper electrodes that passes through the second interlayer insulating layer and the first interlayer insulating layer.

7. The method of claim 6, wherein the forming an etch blocking layer comprises forming the etch blocking layer on a portion of the upper side of the upper electrode adjacent to the at least a side.

8. The method of claim 6, wherein the etching the second interlayer insulating layer and the first interlayer insulating layer to form a cavity comprises forming the cavity which exposes a side of the etch blocking layer and the second stop film.

9. The method of claim 1, wherein:
   the lower electrodes and the upper electrodes comprise at least one of Al, Au, Cu, and an Al—Cu alloy;
   the first and second stop films comprise SiN;
   the first interlayer insulating layer and the second interlayer insulating layer comprise at least one of $SiO_2$, FSG (Fluoro Silicate glass), USG (Undoped Silicate Glass), BPSG (Boron Phospho Silicate Glass), and TEOS (TetraEthOxySilane); and
   the etch blocking layer comprises tungsten.

10. The method of claim 1, comprising forming a contact which is in contact with at least one of the lower electrodes that passes through the first interlayer insulating layer, first stop film, and second stop film, wherein at least one of the second upper electrodes is in contact with the contact.

* * * * *